United States Patent
Kim et al.

(10) Patent No.: US 11,005,484 B2
(45) Date of Patent: May 11, 2021

(54) INTEGRATED CIRCUIT INCLUDING PHASE LOCKED LOOP CIRCUIT

(71) Applicant: Samsung Electronics Co., Ltd., Suwon-si (KR)

(72) Inventors: Gyu Sik Kim, Suwon-si (KR); Woo Seok Kim, Suwon-si (KR); Tae Ik Kim, Seongnam-si (KR); Hwan Seok Yeo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/216,226

(22) Filed: Dec. 11, 2018

(65) Prior Publication Data

US 2020/0021298 A1    Jan. 16, 2020

(30) Foreign Application Priority Data

Jul. 13, 2018 (KR) .......................... 10-2018-0081730

(51) Int. Cl.
     *H03L 7/089*      (2006.01)
     *H03L 7/099*      (2006.01)

(52) U.S. Cl.
     CPC ............ *H03L 7/0895* (2013.01); *H03L 7/099* (2013.01)

(58) Field of Classification Search
     CPC ............................. H03L 7/0895; H03L 7/099
     See application file for complete search history.

(56) References Cited

U.S. PATENT DOCUMENTS

| 6,958,636 | B2 * | 10/2005 | Boerstler .............. H03L 7/0891 327/156 |
| 7,554,857 | B2 | 6/2009 | Lee |
| 8,040,167 | B1 * | 10/2011 | Lin ....................... H03L 7/0895 327/148 |
| 2002/0110034 | A1 | 8/2002 | Song et al. |
| 2003/0038661 | A1 * | 2/2003 | Chokkalingam ..... H03L 7/0895 327/157 |
| 2006/0232318 | A1 | 10/2006 | Iwahori et al. |
| 2013/0229213 | A1 | 9/2013 | Park et al. |
| 2016/0373116 | A1 | 12/2016 | Vahid Far et al. |
| 2017/0345469 | A1 | 11/2017 | Hong et al. |

FOREIGN PATENT DOCUMENTS

JP            11-225244 A2      8/1999
KR    10-2003-0058047 A      7/2003

* cited by examiner

*Primary Examiner* — Lincoln D Donovan
*Assistant Examiner* — Colleen J O Toole
(74) *Attorney, Agent, or Firm* — Muir Patent Law, PLLC

(57) ABSTRACT

A phase locked loop circuit includes a voltage controlled oscillator configured to output a clock signal having a predetermined frequency based in a control voltage, a phase frequency detector configured to compare the clock signal with a reference signal to output a first control signal and a second control signal, a charge pump configured to output the control voltage based on the first control signal and the second control signal, a voltage supply including an output terminal connected to an output terminal of the charge pump by a transmission switch, and a leakage remover circuit connected to the transmission switch and configured to remove a leakage current flowing through the transmission switch while the transmission switch is turned-off.

16 Claims, 12 Drawing Sheets

INTEGRATED CIRCUIT INCLUDING PHASE LOCKED LOOP CIRCUIT

CROSS-REFERENCE TO RELATED APPLICATION(S)

This application claims benefit of priority to Korean Patent Application No. 10-2018-0081730 filed on Jul. 13, 2018 in the Korean Intellectual Property Office, the disclosure of which is incorporated herein by reference in its entirety.

BACKGROUND

1. Field

The present inventive concept relates to an integrated circuit, and more particularly, to a phase locked loop circuit included in the integrated circuit.

2. Description of Related Art

A phase locked loop (PLL) circuit is a circuit adjusting a phase to synchronize a frequency and/or phase of an output signal to a reference signal, and may be used in various fields. A phase locked loop circuit may include a voltage controlled oscillator (VCO), and a loop filter providing a control voltage to a voltage-controlled oscillator, and characteristics of an output signal, generated by a voltage-controlled oscillator, may be determined by the control voltage. Thus, in order to secure a performance of a phase locked loop circuit, various noise components, included in the control voltage outputted by a loop filter, may be effectively removed.

SUMMARY

An aspect of the present inventive concept is to provide a phase locked loop circuit, including a transmission switch outputting a control voltage to significantly reduce an effect of a leakage component, occurring in various circuit elements, on a control voltage.

According to an aspect of the present inventive concept, an integrated circuit may include a phase locked loop circuit. The phase locked loop circuit may include a voltage controlled oscillator configured to output a clock signal having a predetermined frequency based in a control voltage, a phase frequency detector configured to compare the clock signal with a reference signal to output a first control signal and a second control signal, a charge pump configured to output the control voltage based on the first control signal and the second control signal, a voltage supply including an output terminal connected to an output terminal of the charge pump by a transmission switch, and a leakage remover circuit connected to the transmission switch and configured to remove a leakage current flowing through the transmission switch while the transmission switch is turned-off.

According to an aspect of the present inventive concept, an integrated circuit may include a phase locked loop circuit. The phase locked loop circuit may include a voltage controlled oscillator configured to output a clock signal based on a control voltage, a phase frequency detector configured to compare the clock signal with a reference signal to output a first control signal and a second control signal, a charge pump including an output terminal and configured to output the control voltage based on the first control signal and the second control signal, a voltage supply configured to output a first voltage to the output terminal of the charge pump through a transmission switch when the PLL circuit is in a first lock mode, and float an output terminal of the voltage supply when the PLL circuit is in a second lock mode after the first lock mode, and a leakage remover means connected to the transmission switch and the output terminal of the voltage supply, for removing a leakage current flowing through the transmission switch when the PLL circuit is in the second lock mode.

According to an aspect of the present inventive concept, an integrated circuit may include a phase locked loop circuit. The phase locked loop circuit may include an oscillator configured to output a clock signal based on a control voltage, a phase frequency detector configured to compare the clock signal with a reference clock signal to output a first control signal and a second control signal, a charge pump having an output terminal and configured to output the control voltage on the output terminal of the charge pump based on the first control signal and the second control signal, a transmission switch having a first node and a second node, the first node being connected to the output terminal of a charge pump, a voltage supply including an output terminal connected to the second node and a first resistance and a second resistance, and configured to output a voltage to the output terminal of the charge pump through the transmission switch when the PLL circuit is in a coarse lock mode, and float the output terminal of the voltage supply when the PLL circuit is in a fine lock mode after the coarse lock mode, and a buffer having an input terminal connected to the first node and an output terminal connected to the second node through a buffer switch, and configured to block a leakage current flowing through the transmission switch when the PLL circuit is in the fine lock mode.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
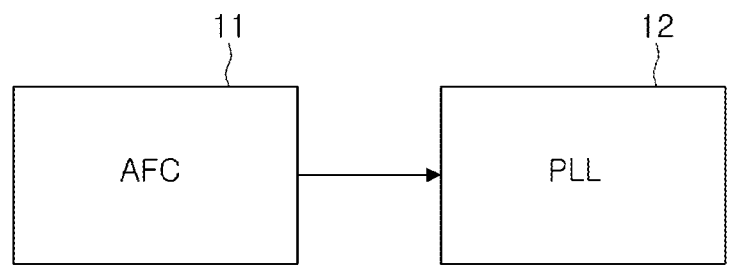
FIGS. 1 and 2 are schematic drawings illustrating a system including a phase locked loop circuit according to example embodiments.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated.

Figure 2:
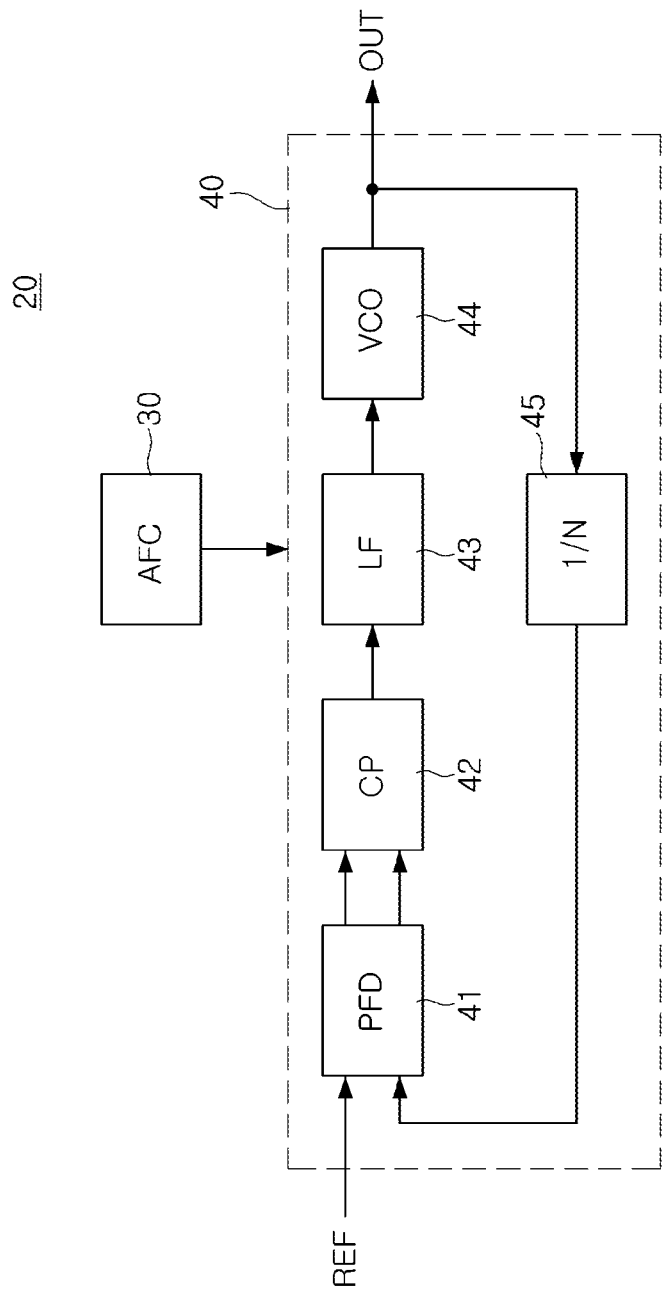

Hereinafter, example embodiments of the present disclosure will be described in detail with reference to the attached drawings. FIGS. 1 and 2 are schematic drawings illustrating a system (or, an integrated circuit) including a phase locked loop circuit according to example embodiments.

First, referring to FIG. 1, a system or an integrated circuit 10 according to an example embodiment may include an automatic frequency controller (AFC) 11, and a phase locked loop (PLL) circuit 12. The phase locked loop circuit is a circuit synchronizing an output signal to a frequency and a phase of an existing signal by adjusting a phase variation rather than an amplitude, and may include a circuit detecting a phase and a frequency, an oscillator, and the like. For example, an oscillator, included in the phase locked loop circuit 12, may be a voltage controlled oscillator (VCO). A frequency and/or phase of a signal, output by the phase locked loop circuit 12, may be adjusted by a control voltage, input to the voltage controlled oscillator.

The automatic frequency controller 11 may control an operation of the phase locked loop circuit 12. For example, the automatic frequency controller 11 adjusts a control voltage, input to the voltage controlled oscillator of the phase locked loop circuit 12, thereby adjusting a frequency and/or phase of an output signal of the phase locked loop circuit 12.

Next, referring to FIG. 2, a system or an integrated circuit 20 according to an example embodiment may include an automatic frequency controller 30 and a phase locked loop circuit 40. The phase locked loop circuit 40 may include a phase frequency detector 41, a charge pump 42, a loop filter 43, a voltage controlled oscillator 44, a frequency divider 45, and the like. A configuration of the phase locked loop circuit 40, illustrated in FIG. 2, is illustrated by way of example, and may be variously modified.

As described above, the phase locked loop circuit 40 may synchronize a frequency and/or phase of an output signal OUT, generated by the voltage controlled oscillator 44, to a reference signal (or, a reference clock signal) REF. To this end, the phase frequency detector 41 may receive feedback of the output signal OUT, and may compare the output signal OUT with the reference signal REF. The frequency divider 45 may be provided in a feedback path of the output signal OUT, and the phase frequency detector 41 may compare a frequency of the reference signal REF with a frequency of the output signal OUT, passing through the frequency divider 45, thereby outputting a signal corresponding to a difference therebetween.

For example, a signal, output by the phase frequency detector 41, may be used as a control signal of the charge pump 42. The charge pump 42 may include a first current source, connected to a first power node, and a second current source connected to a second power node, and a first switch and a second switch may be connected between the first current source and the second current source. An output node of the charge pump 42 may be a node between the first switch and the second switch, and each of the first switch and the second switch may be turned-on or turned-off by signals, output by the phase frequency detector 41.

The charge pump 42 outputs a predetermined control voltage, and a frequency and/or phase of an output signal OUT of the voltage controlled oscillator 44 may be determined by the control voltage, output by the charge pump 42. Meanwhile, to remove a noise component of the control voltage, output by the charge pump 42, the loop filter 43 may be connected between the charge pump 42 and the voltage controlled oscillator 44. For example, a capacitor, included in the loop filter 43, may be charged by a current, output by the charge pump 42, and the control voltage may be input to the voltage controlled oscillator 44 by the charged capacitor.

The phase locked loop circuit 40 may be operated in a coarse lock mode and a fine lock mode, according to the related art. In the coarse lock mode, a voltage supply, capable of providing a proper voltage to the capacitor, included in the loop filter 43, may be activated. For example, the voltage supply may be connected to a capacitor through a transmission switch, implemented as a switch element, and the transmission switch may be turned-on in the coarse lock mode, so the capacitor of the loop filter 43 may be charged by an output voltage of the voltage supply. The voltage supply may be simply implemented as a voltage divider, or the like. When the coarse lock mode is terminated and the fine lock mode begins, the transmission switch is turned-off, so the loop filter may be separated from the voltage supply.

Recently, power, consumed in electronic devices, has become an important issue, in order to reduce power consumption of the phase locked loop circuit 40 mounted on a processor of an electronic device, a power supply voltage VDD for driving the phase locked loop circuit 40 may be lowered. For example, components such as the phase frequency detector 41, the charge pump 42, the loop filter 43, the voltage controlled oscillator 44, and the like are designed in a digital domain, thereby lowering the power supply voltage VDD.

As described above, when the power supply voltage VDD is reduced, a transmission switch may be only implemented as a switch element having a relatively small threshold voltage. Thus, a leakage current may flow through a transmission switch, turned-off in a fine lock mode. The leakage current may affect the control voltage, provided to the voltage controlled oscillator 44 by the loop filter 43. As a result, an output signal of the voltage controlled oscillator 44 may not be precisely synchronized to a desired frequency and/or phase in the fine lock mode.

Moreover, as the power supply voltage VDD is decreased, a ratio (VDD/VTH) of a threshold voltage of the transmission switch to the power supply voltage VDD may be decreased. Thus, an increased turn-on resistance of the transmission switch at a specific voltage may be caused. In order to prevent the settling time from being increased by the increase in a turn-on resistance, a size of a transmission switch may be increased. However, a problem in which a leakage current through a transmission switch in a turn-off state of the transmission switch is increased may occur.

To solve the problem described above, the phase locked loop circuit 40 according to example embodiments may include a leakage remover (or, a leakage remover circuit) significantly reducing an effect of a leakage current through a transmission switch in a turn-off state of the transmission switch on the control voltage. The leakage remover may maintain voltages at both terminals of the transmission switch to the same value, or may be connected to one side of a transmission switch to significantly reduce a change in voltage according to a leakage current. Thus, without the need to increase a size of a transmission switch, a transmission switch may be designed with a desired turn-on resistance, and the settling time of the phase locked loop circuit 40 may be determined to a desired value.

Figure 3:
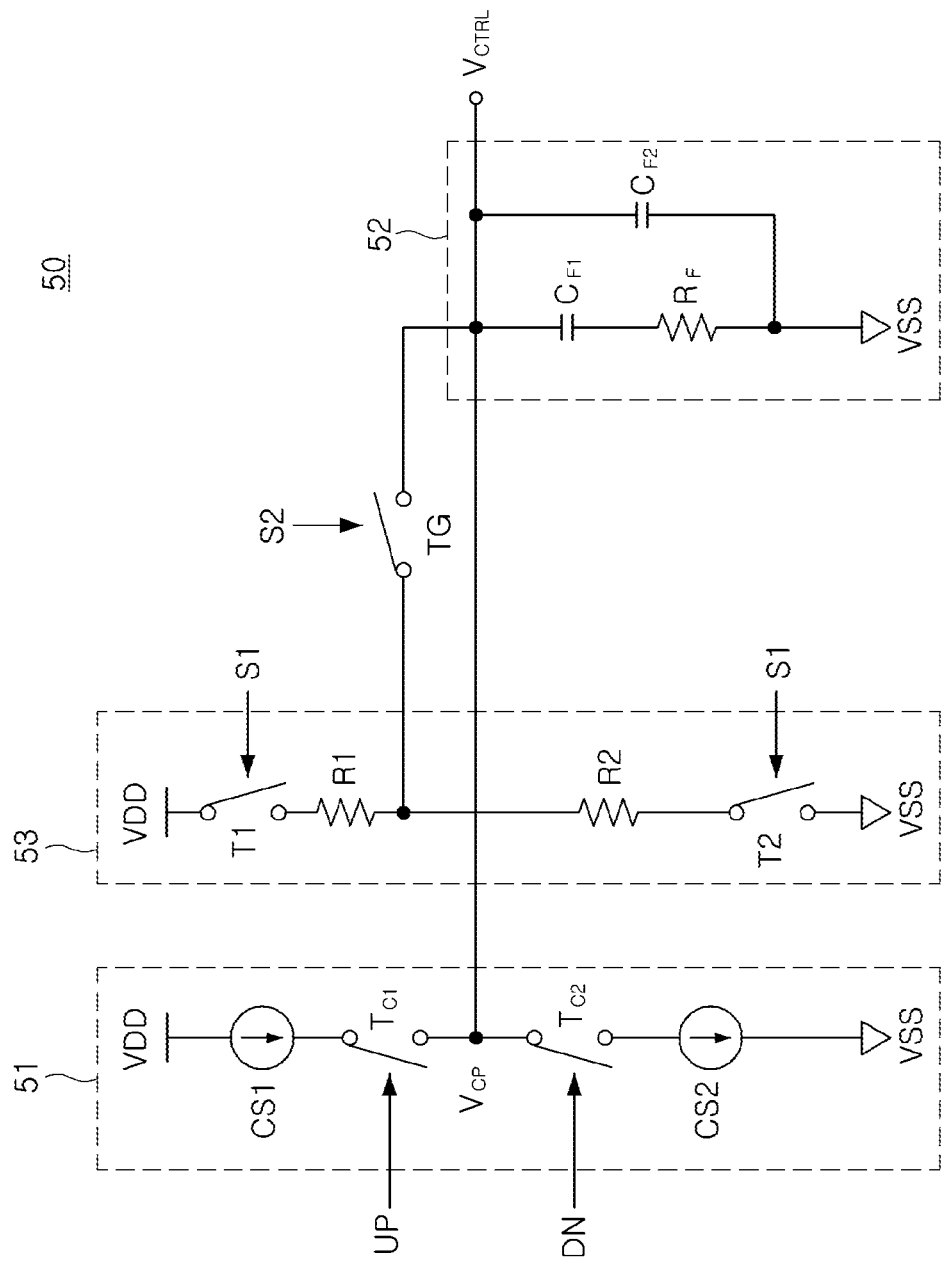
FIG. 3 is a circuit diagram provided to illustrate a part of a phase locked loop circuit.

FIG. 3 is a circuit diagram provided to illustrate a phase locked loop circuit.

FIG. 3 may be a circuit diagram illustrating a charge pump 51, a loop filter 52, and a voltage supply 53 included in a phase locked loop circuit 50 according to the related art. The charge pump 51 may include a first current source CS1, a second current source CS2, a first control switch $T_{C1}$, a second control switch $T_{C2}$, and the like. The first current source CS1 and the first control switch $T_{C1}$ may be connected to a first power node providing a first power supply voltage VDD, while the second current source CS2 and the second control switch $T_{C2}$ may be connected to a second power node providing a second power supply voltage VSS. An output node of the charge pump 51 may be defined as a node between the first control switch $T_{C1}$ and the second control switch $T_{C2}$.

The first control switch $T_{C1}$ and the second control switch $T_{C2}$ may be controlled by a first control signal UP and a second control signal DN, respectively. The first control signal UP and the second control signal DN may have opposite phases. The loop filter 52 may remove a noise component, included in the output voltage $V_{CP}$ of the charge pump 51, thereby generating a control voltage $V_{CTRL}$.

The voltage supply 53 may be connected to the loop filter 52 through the transmission switch TG, and the transmission switch TG may be turned-on in a coarse lock mode. In the coarse lock mode, together with the transmission switch TG, the first switch T1 and the second switch T2 of the voltage supply 53 may be turned-on. Thus, a voltage, determined by a first resistance R1 and a second resistance R2 of the voltage supply 53, may be provided to the loop filter 52. When the coarse lock mode is terminated and the fine lock mode begins, the transmission switch TG is turned-off, so voltage supply 53 may be separated from an output node of the control voltage $V_{CTRL}$.

The transmission switch TG is turned-off in the fine lock mode, so the voltage supply 53 may not affect the control voltage $V_{CTRL}$. However, a leakage current through the voltage supply 53 may be generated by an off resistance of the transmission switch TG in an actual circuit, so a variation of the control voltage $V_{CTRL}$ may be caused thereby.

Figure 4:
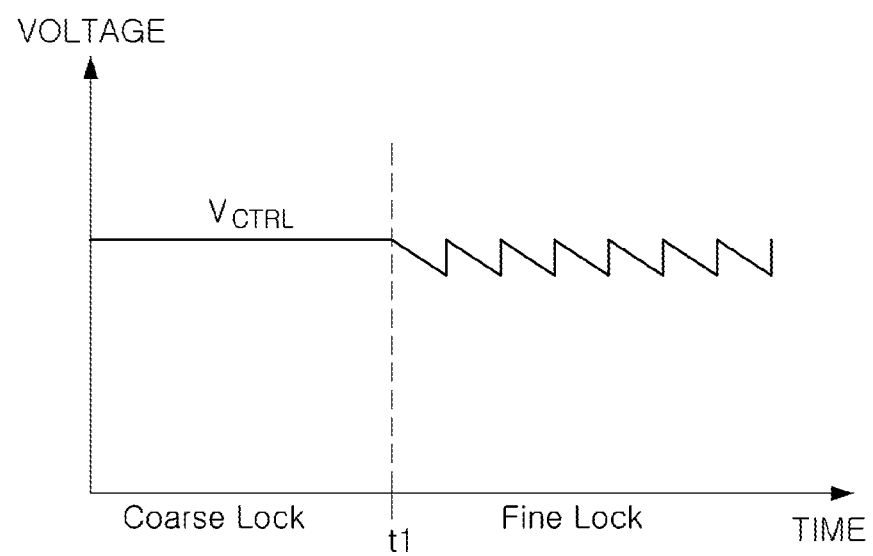
FIG. 4 is a graph provided to illustrate a control voltage of a phase locked loop circuit.

FIG. 4 is a graph provided to illustrate a control voltage of a phase locked loop circuit.

Referring to FIG. 4, after a first time point t1 in which a fine lock mode begins, a control voltage $V_{CTRL}$ may be fluctuated by a leakage current through the transmission switch TG and the voltage supply 53. In detail, when a size of the first power supply voltage VDD is reduced in order to reduce power consumption of the phase locked loop circuit 50, a threshold voltage of the transmission switch TG and an off resistance are reduced together, so a leakage current, affecting a control voltage $V_{CTRL}$, may be generated larger.

Figure 5:
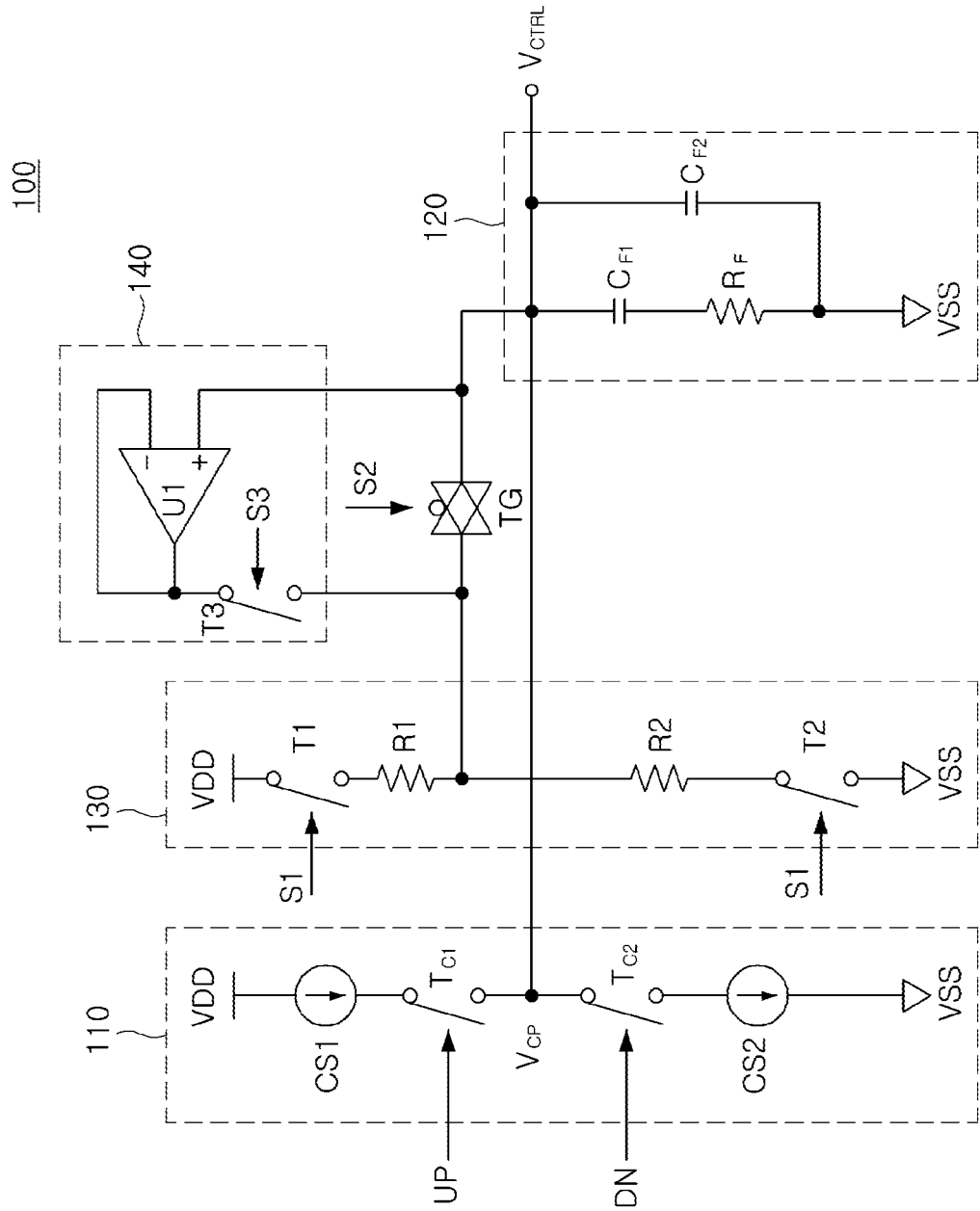
FIGS. 5 and 6 are circuit diagrams provided to illustrate a phase locked loop circuit and an operation of the phase locked loop circuit according to example embodiments.
Figure 6:
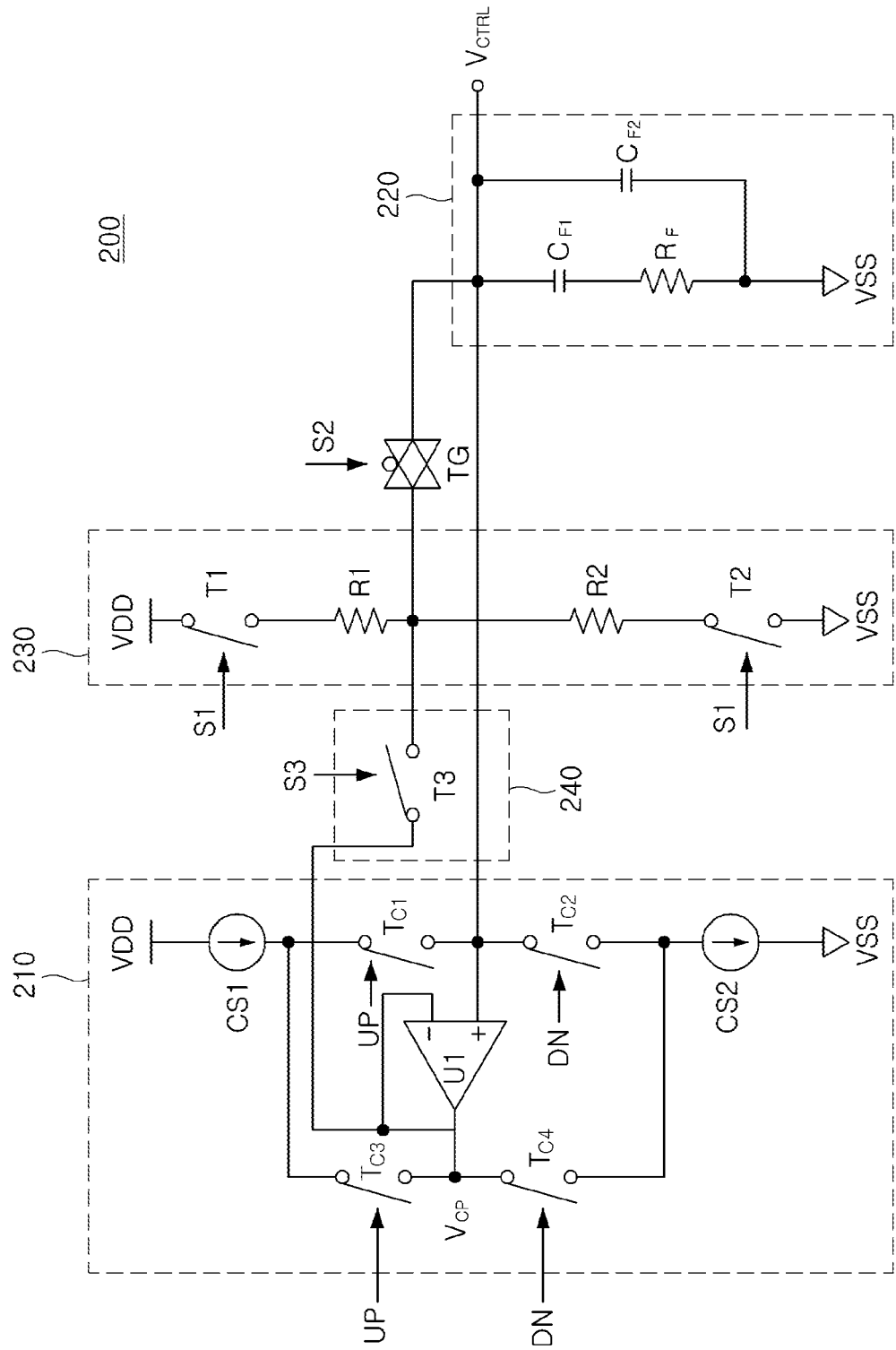

FIGS. 5 and 6 are circuit diagrams provided to illustrate a phase locked loop circuit and an operation of the phase locked loop circuit according to example embodiments.

Referring to FIG. 5, a phase locked loop circuit 100 according to an example embodiment may include a charge pump 110, a loop filter 120, a voltage supply 130, a leakage remover (or, a leakage remover circuit) 140, and the like. The charge pump 110 may have a first current source CS1, operated by a first power supply voltage VDD, and a second current source CS2 connected to a second power supply voltage VSS to be operated, and may generate an output voltage $V_{CP}$ by an on/off operation of the first control switch $T_{C1}$ and the second control switch $T_{C2}$.

The first control switch $T_{C1}$ and the second control switch $T_{C2}$ may be turned on/off by the first control signal UP and the second control signal DN, respectively, and the first control signal UP and the second control signal DN may be generated by a phase frequency detector 41 (as shown in FIG. 2), disposed at a front end of the charge pump 110. The phase frequency detector may compare an output signal of the voltage controlled oscillator with a reference signal REF, thereby generating the first control signal UP and the second control signal DN.

The voltage supply 130 may be implemented as a voltage divider, or the like. The transmission switch TG may include a first node connected to an output terminal of the charge pump 110, and a second node connected to the voltage supply 130. Thus, when the transmission switch TG is turned-on, the voltage supply 130 may be connected to the loop filter 120.

While the phase locked loop circuit 100 is operated in a coarse lock mode, the transmission switch TG, as well as a first switch T1 and a second switch T2 in the voltage supply 130, may be turned-on. Thus, a voltage, determined by a first resistance R1 and a second resistance R2 of the voltage supply 130, may be input to the loop filter 120 through the transmission switch TG. The transmission switch TG may be a switch element, with which a NMOS transistor and a PMOS transistor are combined, and may be replaced with various switch elements. For example, the first switch T1 and the second switch T2 may be controlled by a first switching signal S1, and the transmission switch TG may be controlled by a second switching signal S2. In an example embodiment, the first resistance R1 and the second resistance R2 may have the same resistance value. The transmission switch TG may further include an inverter. PMOS and NMOS transistors of the transmission switch TG may be turned on or turned off by the second switching signal S2. For example, the inverter has an input node connected to a gate of one of the PMOS transistor and the NMOS transistor and an output node connected to the gate of the other of the PMOS transistor and the NMOS transistor. The inverter may receive the second switching signal S2 through the input node to turn on/off the PMOS and NMOS transistors.

When the phase locked loop circuit 100 enters a fine lock mode, in order to prevent the voltage supply 130 from affecting the control voltage $V_{CTRL}$, the transmission switch TG, as well as the first switch T1 and the second switch T2 may be turned-off. In the fine lock mode, an output terminal of the voltage supply 130 may be floated and separated from the first power supply voltage VDD and the second power supply voltage VSS by the first switching signal S1 turned off. However, as described above, due to an off resistance, which may be present in the transmission switch TG, the first switch T1, and the second switch T2, a leakage current through the transmission switch TG and the voltage supply 130 may be generated. The control voltage $V_{CTRL}$ may be fluctuated by the leakage current, which may be an interfering factor in allowing the voltage controlled oscillator to generate an output signal having an accurate phase and frequency.

In an example embodiment, an effect of a leakage current on the control voltage $V_{CTRL}$ may be significantly reduced using the leakage remover 140. Referring to FIG. 5, a leakage remover 140 may include a buffer and a buffer switch T3 connected to an output terminal of the buffer. The buffer may include an operational amplifier U1 having a negative feedback structure. For example, the operational amplifier U1 may be a unity gain operational amplifier. The buffer switch T3 may be connected between an output terminal of the operational amplifier U1 and a second node of the transmission switch TG. An inverting input terminal of the operational amplifier U1 is connected to an output terminal of the operational amplifier U1 through a negative feedback path, and a non-inverting input terminal may be connected to a first node of the transmission switch TG.

When the phase locked loop circuit 100 enters a fine lock mode after the coarse lock mode, the transmission switch TG as well as the first switch T1 and the second switch T2 are turned-off, and the buffer switch T3 may be turned-on. In an example embodiment illustrated in FIG. 5, due to the operational amplifier U1 having a negative feedback structure, voltages of a first node and a second node of the transmission switch TG may be maintained at the same magnitude. Thus, a leakage current, caused by an off resistance of the transmission switch TG, may be significantly reduced or blocked, and the control voltage $V_{CTRL}$ may be maintained at a stable value in the fine lock mode. In an example embodiment, the transmission switch TG, the first switch T1, the second switch T2, the buffer switch T3, and the like may be controlled by an automatic frequency controller (AFC) 30. For example, the AFC 30 may generate the first to third switching signals S1 to S3.

Moreover, in an example embodiment, without a change in design such as a size of the transmission switch TG (e.g., width/length of each of the PMOS and NMOS transistors), or the like, a leakage current through the transmission switch TG may be removed or blocked using the leakage remover 140. In an example embodiment, the correlation between a turn-on resistance and a leakage current according to a size of the transmission switch TG may be removed. Thus, a size of the transmission switch TG, and the like, may be freely determined, so the settling time of the phase locked loop circuit 100 may be designed to a desired value.

As described above, the size of the transmission switch TG is freely determined. In this regard, it may help to improve output voltage distribution of the voltage supply 130. Even when a designed structure of each of the first switch T1 and the second switch T2 is the same, the first switch T1 and the second switch T2 may have different turn-on resistances by variations (e.g., process, voltage and temperature PVT variations). Thus, a resistance value of each of the first resistance R1 and the second resistance R2 is increased, so the output voltage distribution of the voltage supply 130 may be reduced. In this case, the settling time for which an output voltage of the voltage supply 130 is stabilized may be increased. According to the related art, when a size (width/length) of the transmission switch TG is designed to be large in order to reduce the settling time for which the output voltage of the voltage supply 130 is stabilized, a leakage current through a transmission switch TG is increased in a fine lock mode, so the control voltage $V_{CTRL}$ may be fluctuated. However, in an example embodiment, regardless of size of the transmission switch TG, a leakage current is able to be removed or blocked by the leakage remover 140. Thus, the transmission switch TG is designed to be sufficiently large, and a resistance value of each of the first resistance R1 and the second resistance R2 is designed to be large enough, so output voltage distribution of the voltage supply 130 may be reduced, while the settling time of the output voltage of the voltage supply 130 may be also reduced.

Referring to FIG. 6, a phase locked loop circuit 200 according to an example embodiment may include a charge pump 210, a loop filter 220, a voltage supply 230, a leakage remover (or, a leakage remover circuit) 240, and the like. In an example embodiment illustrated in FIG. 6, the leakage remover 240 may be implemented only using a buffer switch T3 without a separate buffer. Referring to FIG. 6, the buffer switch T3 is connected between an output terminal of an operational amplifier U1 included in the charge pump 210 and the transmission switch TG, thereby implementing the leakage remover 240. For example, the charge pump 210 and the leakage remover 240 may share the operational amplifier U1.

Referring to FIG. 6, the charge pump 210 may include first to fourth control switches $T_{C1}$ to $T_{C4}$, a first current source CS1, a second current source CS2, and an operational amplifier U1. An inverting input terminal of the operational amplifier U1 is connected to an output terminal of the operational amplifier U1 through a negative feedback path, and a non-inverting input terminal may be connected to an output terminal of the charge pump 210. Moreover, the output terminal of the operational amplifier U1 may be connected between the third control switch $T_{C3}$ and the fourth control switch $T_{C4}$. The first to fourth control switches $T_{C1}$ to $T_{C4}$ may be turned on/off by the first control signal UP and the second control signal DN, respectively. The operational amplifier U1 may be an element provided to solve a charge sharing problem which may occur in the charge pump 210.

In example embodiments, the leakage remover 240 including the buffer switch T3 may include the operational amplifier U1 and the third and fourth control switches $T_{C3}$ and $T_{C4}$. In this case, the charge pump 210 may be the same as the charge pump 110 of FIG. 5.

The transmission switch TG may include a first node connected to an output terminal of the charge pump 210, and a second node connected to the voltage supply 230. The non-inverting input terminal of the operational amplifier U1 is connected to an output terminal of the charge pump 210, and the buffer switch T3 is connected between an output terminal of the operational amplifier U1 and a second node of the transmission switch TG. Thus, a circuit, as an example embodiment illustrated in FIG. 5, may be implemented. When the buffer switch T3 is turned-on in a fine lock mode, the same voltage at the first node and the second node of the transmission switch TG is maintained by the operational amplifier U1, so a leakage current, caused by an off resistance of the transmission switch TG, may be reduced.

Figure 7:
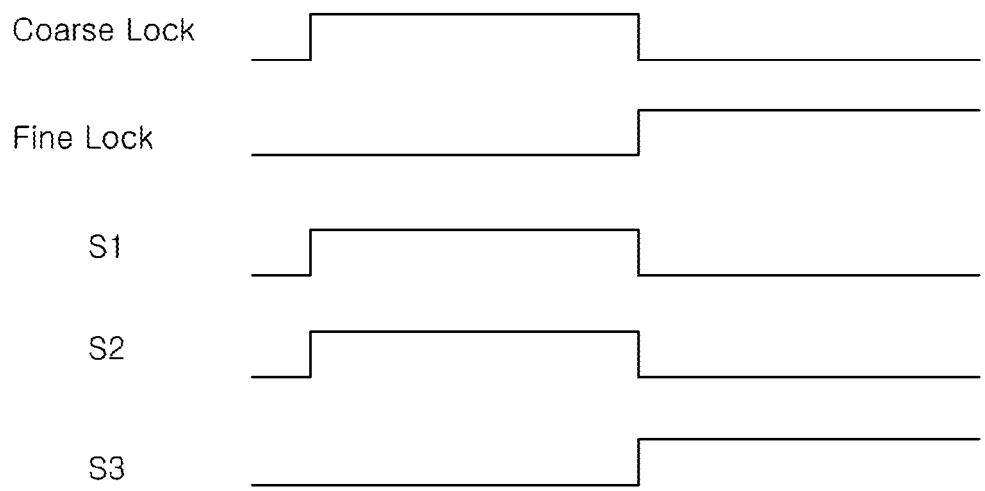
FIG. 7 is a timing diagram provided to illustrate an operation of a phase locked loop circuit according to an example embodiment.

FIG. 7 is a timing diagram provided to illustrate an operation of a phase locked loop circuit according to an example embodiment.

FIG. 7 is a timing diagram provided to illustrate an operation of the phase locked loop circuits 100 and 200 according to the example embodiments illustrated in FIGS. 5 and 6. Referring to FIG. 7, in a coarse lock mode, a first switch T1 and a second switch T2 as well as a transmission switch TG may be turned-on. Then, when a fine lock mode begins, the first switch T1 and the second switch T2, as well as the transmission switch TG are turned-off, and the buffer switch T3 may be turned-on. Thus, the first node and the second node of the transmission switch TG may have the same voltage by the operational amplifier U1 during the fine lock mode. Moreover, while the charge pumps 110 and 210 are operated to output the control voltage $V_{CTRL}$, an effect of a leakage current caused by an off resistance of the transmission switch TG may be reduced.

Figure 8:
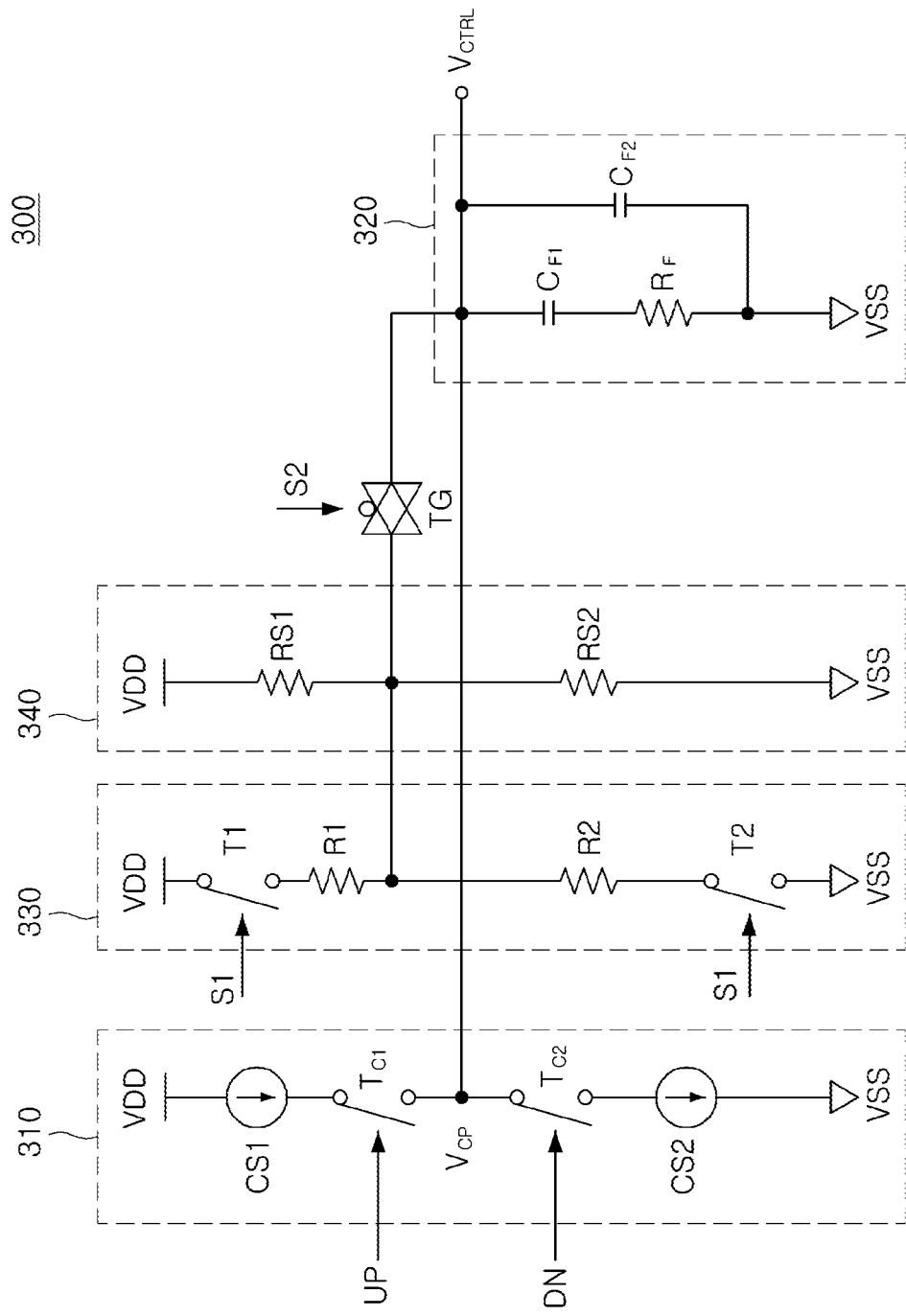
FIG. 8 is a circuit diagram provided to illustrate a phase locked loop circuit and an operation of the phase locked loop circuit according to an example embodiment.

FIG. 8 is a circuit diagram provided to illustrate a phase locked loop circuit and an operation of the phase locked loop circuit according to an example embodiment.

Referring to FIG. 8, a phase locked loop circuit 300 according to an example embodiment may include a charge pump 310, a loop filter 320, a voltage supply 330, a leakage remover 340, and the like. In an example embodiment illustrated in FIG. 8, the leakage remover 340 may be implemented as a voltage divider using a first subresistance RS1 and a second subresistance RS2. For example, the first subresistance RS1 and the second subresistance RS2 may have the same resistance value, and may have a relatively large resistance value, as compared with a first resistance R1 and a second resistance R2 of the voltage supply 330. In an example embodiment, the first subresistance RS1 and the second subresistance RS2 may have resistance values, several tens to several hundreds of the first resistance R1 and the second resistance R2. The first node of the transmission switch TG may be connected to an output terminal of the charge pump 310, and the second node of the transmission switch TG may be connected to a common node between the first subresistance RS1 and the second subresistance RS2.

When a coarse lock mode is terminated and a fine lock mode begins, the transmission switch TG, the first switch T1, and the second switch T2 may be turned-off by the first and second switching signals, respectively. In the case of the phase locked loop circuit 300, a difference between a control voltage $V_{CTRL}$ in a coarse lock mode and a control voltage $V_{CTRL}$ in a fine lock mode may not be significant. As a voltage of the second node of the transmission switch TG is held using the first subresistance RS1 and the second subresistance RS2, having a relatively large resistance value, a leakage current through the transmission switch TG may be reduced. The first subresistance RS1 and the second subresistance RS2 have a resistance value, greater than that of the first resistance R1 and the second resistance R2 included in the voltage supply 330. In this case, power consumption, added by using the leakage remover 340, may not be significant.

Figure 9:
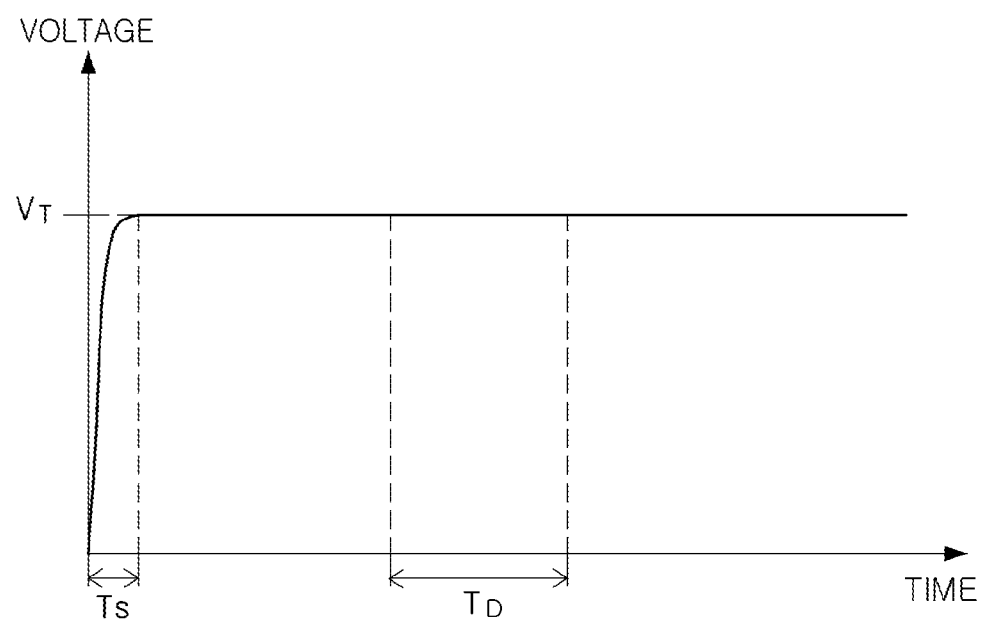
FIGS. 9, 10A and 10B are graphs provided to illustrate an operation of a phase locked loop circuit according to example embodiments.
Figure 10A:
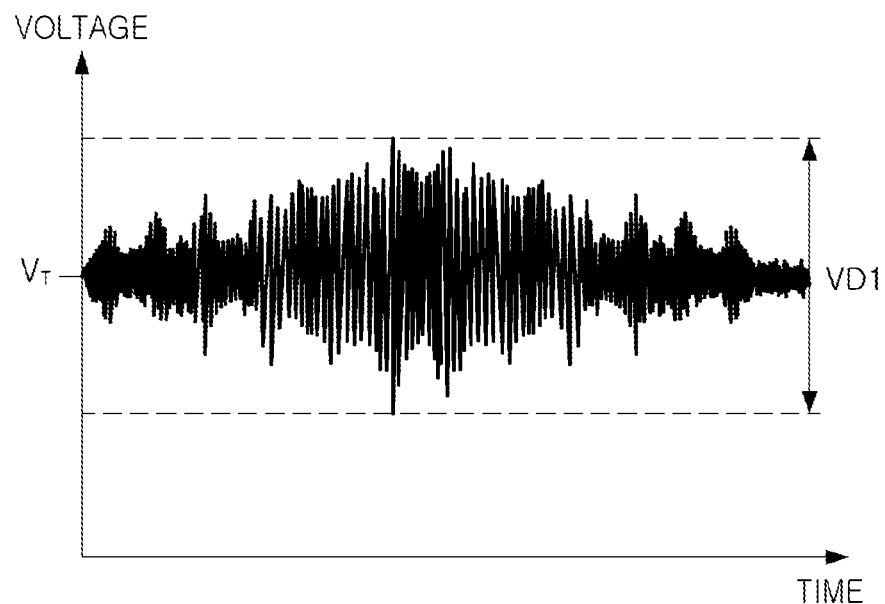
Figure 10B:
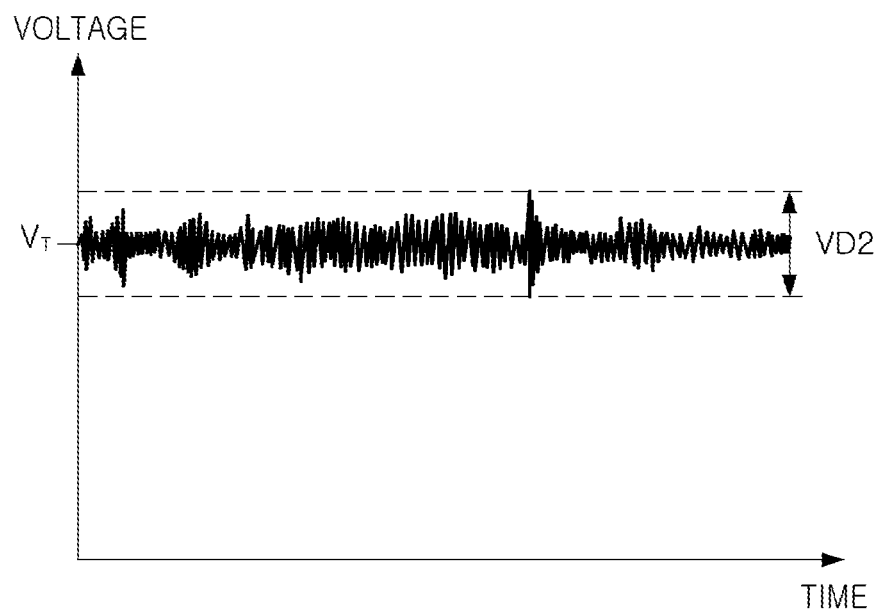

FIGS. 9, 10A and 10B are graphs provided to illustrate an operation of a phase locked loop circuit according to example embodiments.

First, FIG. 9 is a graph illustrating a control voltage input to a voltage controlled oscillator in a phase locked loop circuit according to example embodiments. Referring to FIG. 9, a control voltage is increased for a predetermined settling time $T_S$ and may reach a target voltage $V_T$. Although not illustrated in FIG. 9, the control voltage may be increased to a value greater than the target voltage $V_T$ for the settling time $T_S$.

To generate an output signal having a desired frequency and/or phase by a phase locked loop circuit, an accurate control voltage is required to be input to a voltage controlled oscillator. However, as described above, a leakage current through a transmission switch maintaining a turn-off state in a fine lock mode affects the control voltage, so fluctuation of the control voltage occurs. As a result, a frequency and/or phase, intended by the output signal of the phase locked loop circuit, may not be provided.

As described previously with reference to various example embodiments, in the present disclosure, a difference in voltage at both terminals of the transmission switch is reduced using a leakage remover, so a leakage current may be removed.

In FIGS. 10A and 10B, in which a first section TD of FIG. 9 is enlarged, first, referring to FIG. 10A, a graph, in the case of a phase locked loop circuit not including a leakage remover, a control voltage may be changed by a first variation VD1 based on a target voltage $V_T$. Then, referring to FIG. 10B, illustrating a control voltage in a phase locked loop circuit including a leakage remover, a control voltage may be changed by a second variation VD2 based on a target voltage $V_T$, and the second variation VD2 may be smaller than the first variation VD1. For example, the first variation VD1 may be several tens to several hundreds times the second variation VD2.

Figure 11:
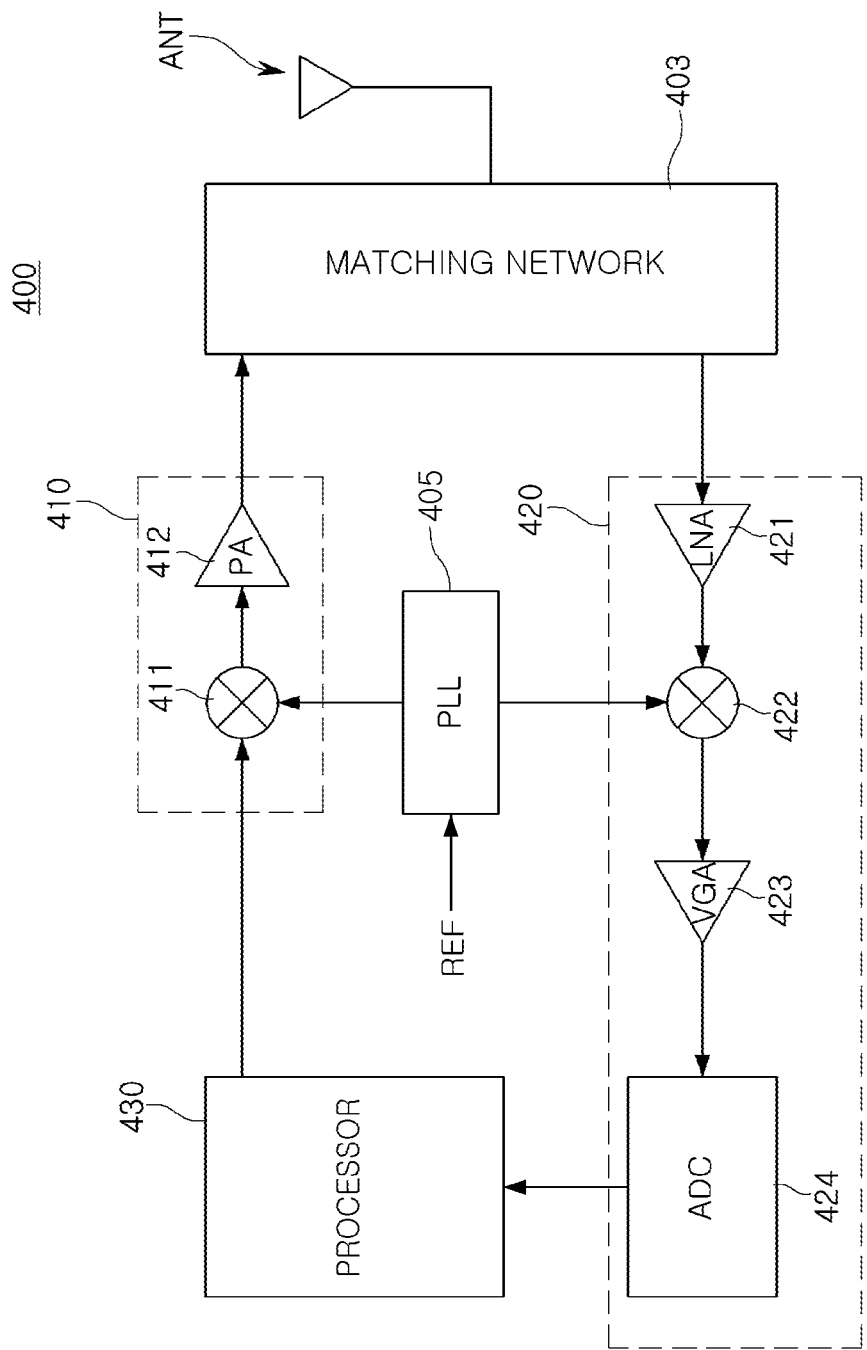
FIG. 11 is a drawing illustrating an RF system including a phase locked loop circuit according to example embodiments.

FIG. 11 is a drawing illustrating an RF system including a phase locked loop circuit according to an example embodiment. However, it should be noted that various systems other than an RF system may be adopted in a phase locked loop circuit according to an example embodiment.

Referring to FIG. 11, an RF system 400 according to an example embodiment may include a transmitting module 410, a receiving module 420, a processor 430, and the like. The transmitting module 410 and the receiving module 420 may share a matching network 403, a phase locked loop circuit 405, antenna ANT, and the like.

When the processor 430 outputs transmission data to be transmitted, the transmitting module 410 may overlap the transmission data in a carrier signal, received from the phase locked loop circuit 405. For example, a mixer 411 may convert the transmission signal into a high frequency signal, and a power amplifier 412 may amplify the transmission signal and output the transmission signal through the matching network 403 and the antenna ANT.

When the antenna ANT receives a received signal, a low noise amplifier 421 may amplify the received signal and deliver the received signal to the mixer 422. The mixer 422 may convert the received signal into the low frequency signal with reference to the output signal of the phase locked loop circuit 405, and the received signal, converted into the low frequency signal, may be amplified by a variable gain amplifier 423. The analog-to-digital converter 424 may convert an output of the variable gain amplifier 423 into digital data, and then deliver the digital data to the processor 430.

The phase locked loop circuit 405 transmits an output signal to both sides, that is, the transmitting module 410 and the receiving module 420, and may serve to fix a frequency to prevent the frequency from being fluctuated, or to accurately change a frequency. Thus, if a frequency of an output signal of the phase locked loop circuit 405 is not stably maintained, an overall performance of the RF system 400 may be degraded.

As described above, the phase locked loop circuit according to example embodiments may reduce a fluctuation of a control voltage in a fine lock mode using a leakage remover. Thus, a voltage controlled oscillator receiving a control voltage to determine a frequency of an output signal may be stably operated, thereby improving a performance such as operational stability of the RF system 400.

Figure 12:
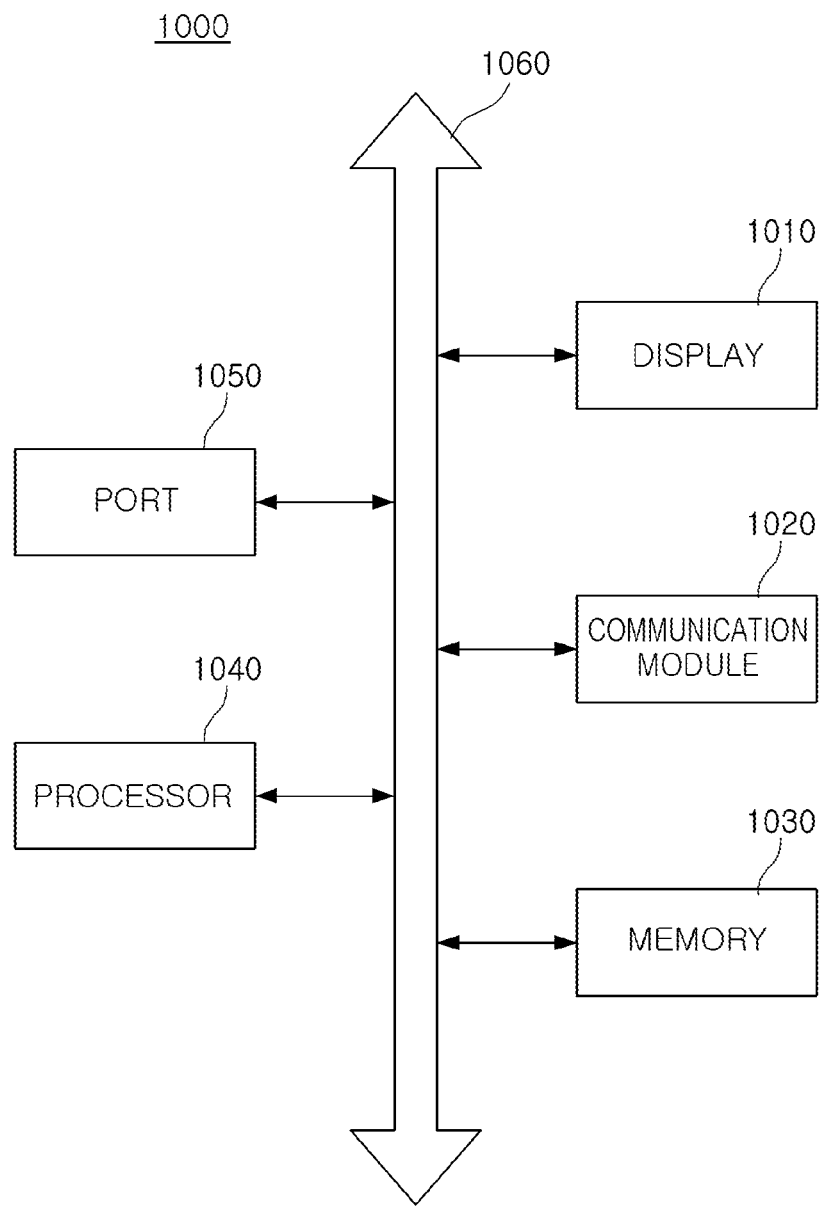
FIG. 12 is a block diagram illustrating an electronic device including a phase locked loop circuit according to example embodiments.

FIG. 12 is a block diagram illustrating an electronic device including a phase locked loop circuit according to an example embodiment.

An electronic device 1000 according to an example embodiment illustrated in FIG. 12 may include a display 1010, a communication module 1020, a memory 1030, a processor 1040, a port 1050, and the like. The electronic device 1000 may further include a power supply, a sensor module, and the like. Among components illustrated in FIG. 12, the port 1050 may be provided for the electronic device 1000 to communicate with a video card, a sound card, a memory card, a universal serial bus (USB) device, and the like. The electronic device 1000 may be a concept including a smartphone, a tablet PC, a smart wearable device, and the like, as well as a desktop computer and a laptop computer according to the related art.

The processor 1040 may perform a certain operation, a command, a task, and the like. The processor 1040 may be a central processing unit (CPU), application processor (AP) or a microprocessor unit (MCU), and may communicate with the display 1010, the communication module 1020, the memory device 1030, and other devices connected to the port 1050 through a bus 1060.

The components such as the display 1010, the communication module 1020, the memory 1030, the processor 1040, and the like may include a phase locked loop circuit according to the example embodiments disclosed above. The phase locked loop circuit according to example embodiments may stable generate a control voltage in a fine lock mode using a leakage remover, thereby accurately maintaining a frequency of an output signal.

As set forth above, according to example embodiments of the present inventive concept, a circuit, using a voltage divider to provide a voltage appropriate for a loop filter, and significantly reducing a leakage current through a transmission switch and a voltage divider, while a transmission switch connecting a voltage divider to a loop filter is turned-off, may be provided. As a leakage current is reduced regardless of design of an element of a transmission switch, a performance of a phase locked loop circuit may be improved without trade off with the settling time.

While example embodiments have been shown and described above, it will be apparent to those skilled in the art that modifications and variations could be made without departing from the scope of the present disclosure, as defined by the appended claims.

What is claimed is:

1. An integrated circuit, comprising:
a phase locked loop (PLL) circuit comprising:
a voltage controlled oscillator configured to output a first clock signal having a predetermined frequency based on a control voltage;
a phase frequency detector configured to compare a second clock signal generated by dividing the first clock signal with a reference signal to output a first control signal and a second control signal;
a charge pump including an output terminal and first and second control switches, the charge pump configured to output the control voltage on the output terminal of the charge pump through the first and second control switches based on the first control signal and the second control signal;
a voltage supply circuit including an output terminal connected to the output terminal of the charge pump by a transmission switch, the voltage supply circuit configured to supply a voltage to the output terminal of the charge pump through the transmission switch; and
a leakage remover circuit connected to the transmission switch and configured to remove a leakage current flowing through the transmission switch while the transmission switch is turned-off,
wherein the voltage supply circuit includes:
a first resistance and a second resistance connected in series between a first power node and a second power node and connected to a common node as the output terminal of the voltage supply circuit,
a first switch connected between the first resistance and the first power node, and
a second switch connected between the second resistance and the second power node, and
wherein the transmission switch includes a first node directly connected to the output terminal of the voltage supply circuit and a second node directly connected to the output terminal of the charge pump.

2. The integrated circuit of claim 1, wherein the first and second switches, and the transmission switch are configured to be turned-on in a coarse lock mode of the PLL circuit, and turned-off in a fine lock mode of the PLL circuit after the coarse lock mode.

3. The integrated circuit of claim 1, wherein the first resistance and the second resistance have the same resistance value.

4. The integrated circuit of claim 1, wherein the leakage remover circuit includes a buffer and a buffer switch connected between an output terminal of the buffer and the second node of the transmission switch.

5. The integrated circuit of claim 4, wherein the buffer includes a unity gain operational amplifier having a non-inverting input terminal connected to the first node of the transmission switch, and an inverting input terminal connected to the buffer switch through a negative feedback path.

6. The integrated circuit of claim 5, wherein the leakage remover circuit and the charge pump are configured to share the unity gain operational amplifier.

7. The integrated circuit of claim 5, wherein the charge pump includes a first current source connected to a first power node, the first control switch connected between the first current source and the output terminal of the charge pump, a second current source connected to a second power node, the second control switch connected between the second current source and the output terminal of the charge pump, and a third control switch and a fourth control switch connected in series between the first power node and the second power node, and
wherein the non-inverting input terminal is connected to the output terminal of the charge pump, and the inverting input terminal is connected to a node connected to the third control switch and the fourth control switch through the negative feedback path.

8. The integrated circuit of claim 4, wherein the buffer switch is configured to be turned-off in a coarse lock mode of the PLL circuit, and turned-on in a fine lock mode of the PLL circuit.

9. The integrated circuit of claim 1, wherein the leakage remover circuit includes a first subresistance and a second subresistance connected in series between a first power node and a second power node and connected to the output terminal of the charge pump through the transmission switch.

10. The integrated circuit of claim 9, wherein a resistance value of each of the first subresistance and the second subresistance is greater than a resistance value of each of the first resistance and the second resistance.

11. An integrated circuit comprising:
a phase locked loop (PLL) circuit comprising:
a voltage controlled oscillator configured to output a first clock signal having a predetermined frequency based on a control voltage;
a phase frequency detector configured to compare a second clock signal, generated by dividing the first clock signal, with a reference signal to output a first control signal and a second control signal;
a charge pump including an output terminal and first and second control switches, the charge pump configured to output the control voltage on the output terminal of the charge pump through the first and second control switches based on the first control signal and the second control signal;
a voltage supply circuit including an output terminal connected to the output terminal of the charge pump by a transmission switch, the voltage supply circuit configured to supply a voltage to the output terminal of the charge pump through the transmission switch;
a leakagae remover circuit connected to the transmission switch and configured to remove a leakage current flowing through the transmission switch while the transmission switch is turned-off; and
a frequency divider configured to divide the first clock signal and provide the second clock signal to the phase frequency detector,
wherein the voltage supply circuit includes:
a first resistance and a second resistance connected in series between a first power node and a second power node and connected to a common node as the output terminal of the voltage supply circuit,
a first switch connected between the first resistance and the first power node, and
a second switch connected between the second resistance and the second power node, and
wherein the transmission switch includes a first node directly connected to the output terminal of the voltage supply circuit and a second node directly connected to the output terminal of the charge pump.

12. The integrated circuit of claim 11,
wherein when the PLL circuit is in a first lock mode, the output terminal of the voltage supply circuit is electrically connected to the output terminal of the charge pump by the transmission switch.

13. The integrated circuit of claim 12, further comprising:
a third switch connected between an output terminal of the leakage remover circuit and the output terminal of the voltage supply circuit, and configured to be turned off when the PLL circuit is in the first lock mode and turned on when the PLL circuit is in a second lock mode after the first lock mode,
wherein the first and second switches and the transmission switch are configured to be turned on when the PLL circuit is in the first lock mode and turned off when the PLL circuit is in the second lock mode.

14. The integrated circuit of claim 13, further comprising:
an automatic frequency controller configured to control the first to third switches and the transmission switch.

15. The integrated circuit of claim 1, further comprising:
a filter resistance and a filter capacitor connected between the second power node and the first node.

16. The integrated circuit of claim 1, wherein the first power node provides a first power supply voltage, and the second power node provides a second power supply voltage having a magnitude lower than a magnitude of the first power supply voltage.

* * * * *